United States Patent [19]
Bruckner et al.

[11] Patent Number: 5,560,795
[45] Date of Patent: Oct. 1, 1996

[54] PROCESS FOR MANUFACTURING A PRINTED CIRCUIT BOARD AND PRINTED CIRCUIT BOARD

[75] Inventors: Helmut Bruckner, Eitorf; Siegfried Köpnick, Troisdorf, both of Germany; Werner Uggowitzer, Ferlach, Austria

[73] Assignee: Philips Electronics N.V., Eindhoven, Netherlands

[21] Appl. No.: 232,166

[22] PCT Filed: Nov. 1, 1992

[86] PCT No.: PCT/EP92/02507

§ 371 Date: Aug. 2, 1994

§ 102(e) Date: Aug. 2, 1994

[87] PCT Pub. No.: WO93/09655

PCT Pub. Date: May 13, 1993

[30] Foreign Application Priority Data

Oct. 31, 1991 [DE] Germany .................. 41 35 839.9

[51] Int. Cl.⁶ .................. B32B 31/18; B32B 31/20
[52] U.S. Cl. .................. 156/182; 156/223; 156/252; 156/293; 156/298; 156/300; 29/846; 29/853
[58] Field of Search .................. 156/182, 252, 156/298, 299, 300, 223, 293; 29/846, 849, 853; 174/253, 259

[56] References Cited

U.S. PATENT DOCUMENTS

| | | | |
|---|---|---|---|
| 3,388,457 | 7/1968 | Totta | 29/846 |
| 4,528,064 | 7/1985 | Ohsawa et al. | 156/630 |
| 4,751,126 | 6/1988 | Oodaira et al. | 428/139 |
| 4,894,317 | 1/1990 | Maruyama et al. | |

FOREIGN PATENT DOCUMENTS

| | | |
|---|---|---|
| 146241 | 6/1985 | European Pat. Off. . |
| 253892 | 7/1987 | European Pat. Off. . |
| 2246208 | 9/1971 | Germany . |

Primary Examiner—Michael W. Ball
Assistant Examiner—Sam Chuan Yad
Attorney, Agent, or Firm—Millen, White, Zelano, & Branigan, P.C.

[57] ABSTRACT

Producing a printed circuit board having at least two layers and having a carrier board, a first Conductor layer having contact areas and a second conductor layer having connecting areas, in which a conductive foil, provided with an adhesive coating, is laminated onto the carrier board having the first conductor layer and the contact areas, the adhesive coating an the conductive foal having holes which correspond with the contact areas of the first conductor layer. The perforated conductive foil, provided with the adhesive coating, is compressed and laminated with the carrier board having the first conductor layer, the contact areas of the first conductor layer being bulged at least partially through the holes in the adhesive coating in the direction of the surface of the connecting areas of the second conductor layer so that the surfaces of the contact areas are in each case at a distance from the surface of the connecting areas of the second conductor layer which is less than the thickness of the connecting areas. Subsequently, the second conductor layer having the connecting areas is produced from the conductive foil, the connecting areas of the second conductor layer bounding the holes in the adhesive coating, after which the contact areas of the first conductor layer can be electrically conductively connected to the corresponding connecting areas of the second conductor layer, through the holes in the adhesive coating.

20 Claims, 3 Drawing Sheets

PROCESS FOR MANUFACTURING A PRINTED CIRCUIT BOARD AND PRINTED CIRCUIT BOARD

TECHNICAL FIELD

The invention relates to a method for producing a printed circuit board (PCB) with at least two layers in accordance with the description herein. In addition, the subject-matter of the present invention is a printed circuit board having at least two layers, in accordance with the description herein.

Multilayer printed circuit boards having two or more conductor layers which are interconnected by means of through-hole connections, are used on a large scale in the electronics industry. Printed circuit boards having at least three layers are designated multilayer printed circuit boards or multilayers.

BACKGROUND ART

In order to produce electrically conductive connections between the individual conductor planes of multilayer printed circuit boards, methods are known for the electrochemical metallization (through-plating) of previously drilled or punched holes. This type of through hole plating is normally used only in the case of epoxy resin glass laminates and is technically very complex, and hence expensive.

In the case of two-layer printed circuit boards consisting of base materials which are copper-laminated on both sides, it is known for the electrically conductive connection of conductor tracks on both sides to be produced by pressing an electrically conductive paste into previously drilled holes. The conductive paste is subsequently cured under the influence of relatively high temperatures. This method suffers from insufficient reliability of the through hole connecting.

DE-A-1,540,249, EP-A2-0,137,279, and FR-A-1,464,288 each disclose methods in which a further, relatively thin printed circuit board layer consisting of a carrier material layer with a ready-etched conductor pattern is applied onto a carrier board. The electrically conductive connection of the contact areas or connecting areas of the individual planes (layers) takes place by soldering, through hole connecting taking place only in the region of the leads of component parts. In consequence, the practical usefulness of the method is limited.

A similar method is disclosed in U.S. Pat. No. 3,052,823, the laminated-on second or further printed circuit layer having openings in order to obtain access to the contact areas of the conductor layer located underneath in each case. The through-connecting takes place by means of soldering in the edge regions of these openings, it being possible to connect contact points or connecting points which lie side-by-side directly, that is to say without the aid of connecting wires. This method provides sufficient reliability only in the case of hand soldering, so that large-scale industrial use could not be implemented.

DE-B1-1,923,199 discloses a method for producing a circuit board having at least two conductor layers which are separated from one another by insulating layers, in the case of which method the conductor layers are connected at points by means of contact spots, which are coated for example with solder, through openings in the insulating layers. The through-connecting takes place by pressing on the contact areas, using selective pressure, the outer layer being pressed onto the inner layer and being connected thereto. U.S. Pat. No. 4,319,708 also discloses a similar method. These methods are extremely complex and do not permit the production of high density multilayer circuit boards.

A multilayer is described in EP-A 0 146 241. Conductor layers consisting of a conductive resinous composition are produced on the opposite surfaces of at least two carrier materials and an interposed carrier material, . At determined points the carrier material is punched and all carrier materials subsequently are thermolaminated. By this a multilayered circuit board is produced without pads and external carrier material on both sides. The technique described in the aforementioned document, however, cannot be applied for metallic printed circuit.

Finally, DE-A1-3,152,603 (=EP-A1-0,067,231) discloses a method of the generic type in which an insulation coating which leaves the contact areas free is initially applied onto a carrier board having a first conductor layer and contact areas. A copper foil is laminated onto this insulation coating, via an adhesive coating, the adhesive coating and the copper foil having holes at the points at which the contact areas of the first conductor layer are located. Subsequently, the second conductor layer having connecting areas is produced from the copper foil by etching, the connecting areas being constructed as solder eyes which surround the holes in the adhesive coating. The connecting of the solder eyes with the contact areas takes place by the application of a conductive material, such as silver conductive paste or solder. In this method, the contact areas of the first conductor layer are separated from the solder eyes of the second conductor layer only by the thickness of the adhesive coating. Nevertheless, connection of the contact areas to the solder eyes by automatic soldering, for example by wave soldering, is not sufficiently reliable. DE-A1-2,716,545 also discloses a similar method.

OBJECT

The object of the present invention is thus to provide the improved method described and a printed circuit board having at least two layers, as described, claim 7 to the effect that the electrically conductive connections between the contact areas of the first conductor layer and the corresponding connecting areas of the second conductor layer can take place simply and reliably.

DESCRIPTION OF INVENTION

The method for achieving this objective generally involves producing a printed circuit board (1) having at least two layers and having a carrier board (2), a first conductor layer (7) with contact areas (pads 6) and a second conductor layer (19) with connecting areas (solder eyes 16), in which a conductive foil (11), provided with an adhesive coating (10), is laminated onto the carrier board (2) having the first conductor layer (7) and the contact areas (pads 6), at a temperature of more than 80° C., the adhesive coating (10) and the conductive foil (11) having holes (12) which correspond to the contact areas (pads 6) of the first conductor layer (7), the second conductor layer (19) having the connecting areas (solder eyes 16) is subsequently produced from the conductive foil (11), the connecting areas (solder eyes 16) of the second conductor layer (19) bounding the holes (12) in the adhesive coating (10), after which the contact areas (pads 6) of the first conductor layer (7) can be electrically conductively connected to the corresponding connecting areas (solder eyes 16) of the second conductor layer (19) through the holes (12) of the adhesive coating (10), by means of soldering or by the application of a conductive paste,
characterized in that the perforated conductive foil (11), provided with the adhesive coating (10), is laminated at a pressure of 50 to 150 bar onto the carrier board (2) having the first conductor layer (7), the contact areas (6) of the first conductor layer (7) being bulged at least partially through the holes (12) of the adhesive coating (10) and of the conductive foil (11) in the direction of the outer surface of the conductive foil (11), so that—after subsequently producing the second conductor layer (19) with the connecting areas (16) from the conductive foil (11)—the surfaces of the contact areas (6) are in each case at a distance from the surface of the connecting areas (16) which is less than the thickness of the conductive foil (11).

The printed circuit board (1) for achieving this objectives has at least two layers, having a first conductor layer (7) and a second conductor layer (19) which is separated therefrom by an adhesive coating (10), the first conductor layer (7) having contact areas (pads) (6) and the second conductor layer having connecting areas (solder eyes 16) corresponding thereto, and the contact areas (6) and the corresponding connecting areas (16) being capable of being electrically conductively connected to one another, the adhesive coating (10) having holes (12) at the points at which the contact areas (6) can be electrically conductively connected to the corresponding connecting areas (16), characterized in that the contact areas (6) of the first conductor layer (7) are bulged at least partially through the holes (12) in the adhesive coating (10) in the direction of the surface of the connecting areas (16) of the second conductor layer (19), and in that the surface of the contact areas (6) are in each case at a distance from the surface of the connecting areas (16) of the second conductor layer (19) which is less than the thickness of the connecting areas (16).

First of all, an adhesive-coated conductive foil is laminated onto a carrier laminate (carrier board), which is provided with a first conductor layer (first plane) on at least one side, under the influence of a high pressure of 50 to 150 bar, especially from 80 to 120 bar, and at a temperature of at least 80° C. The compression preferably takes place in multi-opening presses, in which case the laminate should be at a temperature of over 140° C. for at least 5 minutes. Under these pressing conditions, the material of the carrier board softens so that the contact areas of the first conductor layer bulge at least partially, that is to say in a subregion of their surface, through the holes of the adhesive-coated conductive foil in the direction of the surface of the conductive foil. This bulging out or up of the contact areas of the first conductor layer takes place only at the points at which the perforated conductive foil has holes, since the opposing pressure is absent, or is at least less, at these points during the compression.

The carrier board which is provided with the first conductor layer can be produced from a copper-coated laminate (base material) in a manner which is known per se, for example by etching (substractive method). However, other methods which are known from the prior art, such as the additive technique or the like, can also be used.

A laminate consisting of paper layers impregnated with resin is preferably used as the carrier board, especially phenol-resin paper laminates (FR-2) such as those marketed under the trademark TROLITAX® DN 8034 by Hüls Troisdorf AG. When the perforated conductive foil, which is provided with the adhesive, is being laminated on under pressure, the resin should soften at least to such an extent that the desired bulging out or up of the, for example, copper material of the contact areas of the first conductor layer through the holes in the laminated-on conductive foil is possible in the direction of the surface of the conductive foil, or connecting areas of the second conductor layer.

According to a preferred embodiment of the invention, the perforated conductive foil having an adhesive coating is laminated directly, that is to say without an additional insulation coating, onto the carrier board having the first conductor layer. In this case, the adhesive forms the only insulation (insulation coating) between the first and the second conductor layer.

According to a preferred embodiment of the invention, an acrylate adhesive which can be softened by heat is used as the adhesive. The adhesive coating preferably has a thickness of 20 to 150 μm, especially from 35 to 60 μm. Surprisingly, it has been found that the insulation resistance between the first and the second conductor layer is completely adequate, even at the conductor crossing points, despite the extremely small thickness of the adhesive coating. The adhesive preferably has a glass transition temperature of 50°–70° C.

The conductive foil having an adhesive coating is provided with a hole, for example by punching, at the points at which through-connecting, that is to say a conductive connection, is subsequently intended to take place between the contact areas of the conductors in the first layer and the corresponding connecting areas of the conductors in the second layer. The holes are preferably smaller than the corresponding contact areas of the first conductor layer, the holes—seen in the projection—being in each case located completely inside the corresponding contact areas after the coating material has been laminated on.

After punching or drilling of the adhesive-coated conductive foil, said foil is fixed, for example by means of a number of adhesive spots in the edge region, on the carrier board which is provided with the first conductor layer. Subsequently, the perforated conductive foil is laminated with the carrier board. The lamination of the perforated coating material with the carrier board takes place preferably at a temperature above the glass transition temperature $T_G$ of the resin of the carrier board (base material), especially at a temperature of 140° to 180° C. The bulging out of the contact areas of the first conductor layer, which is achieved in this way, into the holes of the laminated-on, adhesive-coated, conductive foil has a decisively favorable effect on the subsequent electrically conductive connection of the contact areas of the first conductor layer to the connecting areas of the second conductor layer, so that this connection can take place especially by automatic soldering, for example in a wave-soldering or flow-soldering bath, with high reliability. After the compression, the distance between the surface of the contact areas (at their highest elevation) and the surface of the conductive foil is less than the thickness of the conductive foil, preferably less than half the thickness of the conductive foil, and, in particular, is less than 10 μm.

After lamination, the upper conductor layer is etched out of the conductive foil, for example in a manner known per se, so that the upper conductor pattern having the connecting areas is all that is left of the conductive foil. The connecting areas of the upper conductor layer are located at the points at which the conductive foil has the holes and, at least, partially border these holes and preferably completely enclose the holes of the laminated-on coating material and thus in each case form a solder eye. The contact areas of the first conductor layer, located underneath, are visible through the solder-eye holes and the holes in the adhesive coating.

After etching, the multilayer printed circuit board is preferably provided in a manner known in the art with a solder resist, is drilled or punched, is assembled, and is subsequently automatically soldered. In this case, the solder resist is applied onto the second conductor layer such that in each case an area of the connecting areas of the second conductor layer is left untouched by the solder resist and therefore can be wetted with solder. This area free of solder resist is for example in the shape of a solder eye which encloses the part of the contact area of the first conductor layer which is visible through the hole in the adhesive coating. This results in a particularly reliable connection of the contact areas to the connecting areas, since the liquid solder is distributed uniformly on both areas (contact areas and connecting areas).

During soldering, the contact areas of the first conductor layer are electrically conductively connected to the corresponding connecting areas of the second conductor layer at those points at which the laminated-on, adhesive-coated, conductive foil had the holes. If required, the electrically conductive connection of the contact areas of the first conductor layer to the corresponding connecting areas of the second conductor layer can also take place by the application and curing of an electrically conductive paste, for example a silver paste. However, a connection by soldering is more cost-effective and is thus preferred.

During lamination of the perforated conductive foil having an adhesive coating to the carrier laminate (carrier board), it is impossible to prevent completely getting a small quantity of the adhesive penetrating into the holes in the conductive foil, and hence partially covering the contact areas of the first conductor layer. According to a preferred embodiment of the invention it is proposed that holes be provided through the carrier board inside the connecting areas or solder eyes of the upper conductor layer. These holes, for example having a diameter of 0.7 mm, thus penetrate the connecting areas or solder eyes of the upper (second) conductor layer, the contact areas of the first conductor layer and the carrier board completely. During soldering in a wave-soldering or flow-soldering bath, the adhesive residue which at least partially vaporizes as a result of the high temperature of the solder can be dissipated through these vent holes to the opposite printed circuit board surface. In this way, the reliability of the solder connection can be further increased.

The method according to the invention makes it possible to produce printed circuit boards (PCB's) with at least two layers (planes) in a surprisingly simple and cost-effective manner, such PCB's having a first conductor layer and a second conductor layer which are separated by an adhesive coating, the first conductor layer having contact areas (pads) and the second conductor layer having connecting areas (solder eyes) corresponding thereto, and it being possible to electrically connect the contact areas with the corresponding connecting areas. Since the adhesive coating has holes at the points at which the contact areas can be electrically conductively connected to the corresponding connecting areas, through which holes the contact areas of the first conductor layer are bulged at least partially in the direction of the surface of the connecting areas of the second conductor layer, and since the surfaces of the contact areas are in each case at a distance from the surface of the connecting areas of the second conductor layer which is less than the thickness of the conductive foil which provides the second conductor layer, electrically conductive connections having particularly high reliability are achieved even by means of automatic soldering.

It is particularly advantageous if the holes in the insulation coating are smaller than the corresponding contact areas of the first conductor layer and if the surfaces of the holes—seen in the projection—are located in each case completely inside the corresponding contact areas.

To the extent that this description refers to a first and a second conductor layer, this includes the fact that it is also possible to apply further conductor layers (planes) in a corresponding manner. Furthermore, it is possible to start from a carrier board which is laminated with copper on both sides, in order thus to obtain a PCB having a total of three layers by means of single-sided coating using a conductive foil, or a four-layer printed circuit board, as a result of applying in each case one conductive foil on both sides.

BRIEF DESCRIPTION OF DRAWINGS

Following, the invention is explained in more detail using an exemplary embodiment and the drawing, in which.

BEST MODE FOR CARRYING OUT THE INVENTION

Figure 1:
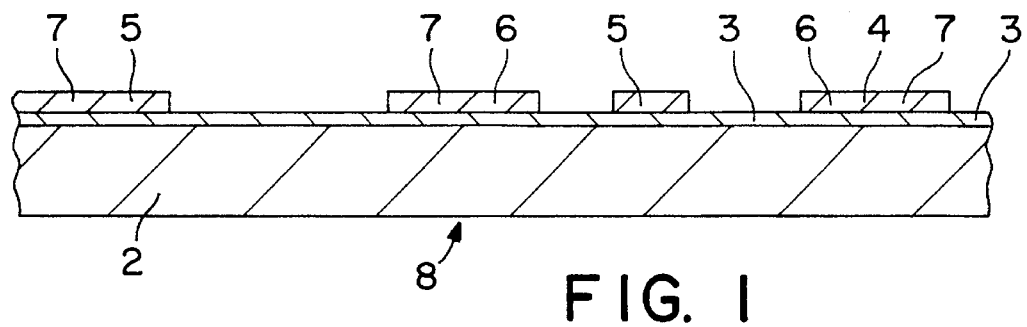
FIG. 1 shows a carrier board having the first conductor layer, in section.

The exemplary embodiment of the invention represented in the following text is based on a commercially-available, single-sided, copper-laminated base material having a 35 µm copper foil. This base material (laminate) can be supplied by Hüls Troisdorf AG under the designation TROLITAX® DN 8034. The laminate consists of a carrier board 2 based on phenol-resin paper, an adhesive coating 3 and a copper foil 4. A printed circuit board 8 having a (first) conductor layer 7 with conductor tracks 5 and contact areas (pads) 6 is produced in a manner known per se by etching from the laminate (FIG. 1).

Figure 2:
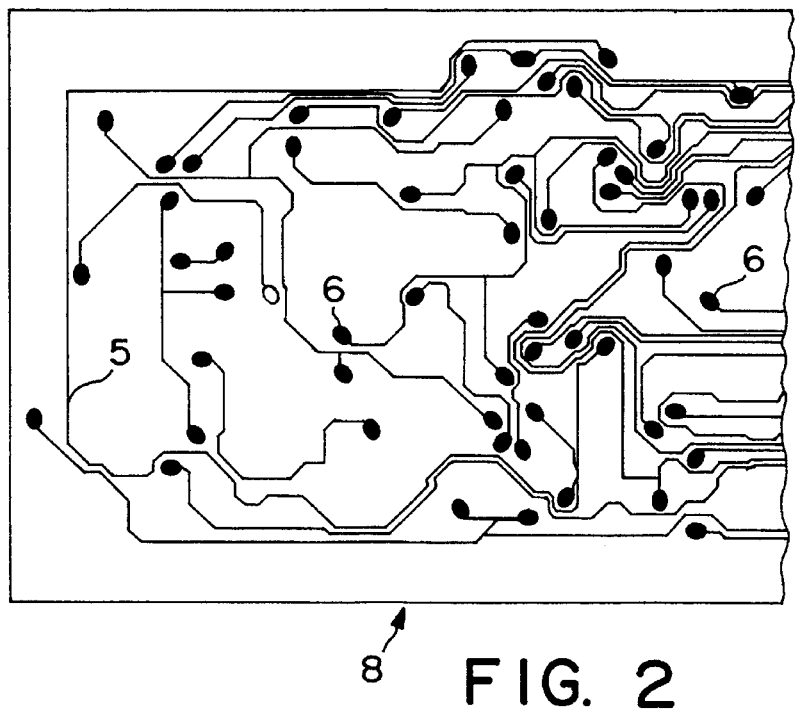
FIG. 2 shows a plan view of the carrier board according to FIG. 1.

FIG. 2 shows that the contact areas 6 have an approximately circular or oval shape. The precise shape of these contact areas 6 is not critical, since only the shape of the holes 12 in the adhesive-coated, perforated copper foil 9 governs the subsequent shape of the contact areas 6 which can be soldered.

In order to produce the perforated conductive foil 9 having an adhesive coating, a copper foil 11 having a thickness of 35 µm is provided with an adhesive coating 10 having a thickness of 40 μm. A commercially-available acrylate adhesive is used as the adhesive, which is (initially) cured into the B-stage, a glass (transition) temperature $T_G$ of 60° C. being set. It is important that the adhesive forming the adhesive coating 10 cross-links only to the extent that an adequate adhesive capability remains in order to achieve an adequate adhesion to the subsequent laminate 1. On the other hand, the adhesive should have a viscosity which is sufficiently high largely to suppress the adhesive penetrating into the holes 12 in the copper foil 11 during compression.

Figure 5:
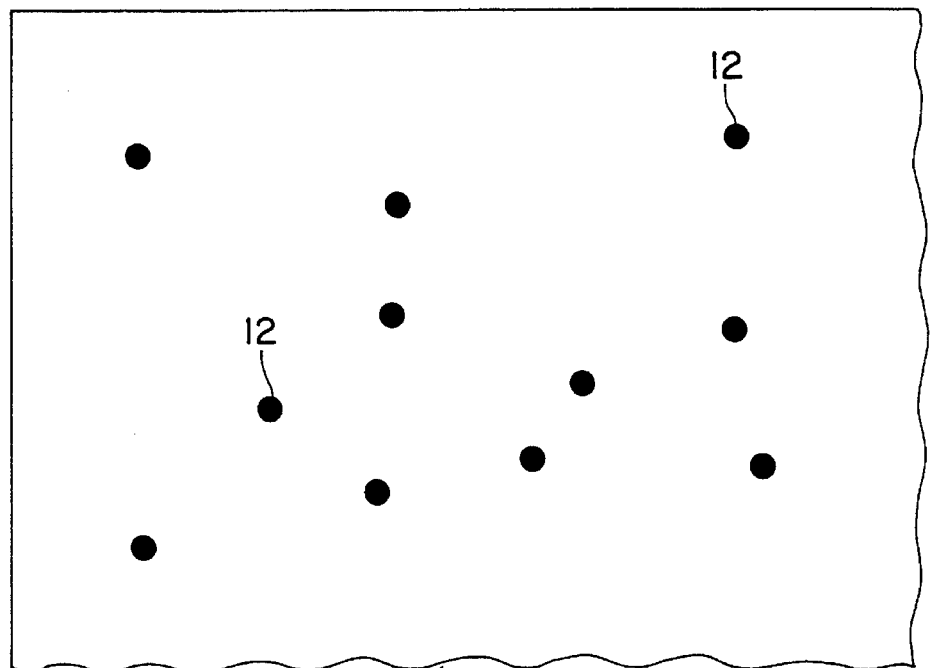
FIG. 5 shows a plan view of the carrier board according to FIG. 4.

The copper foil 11 (conductive foil) which is provided with the adhesive coating 10 is subsequently perforated using a punching tool, so that a hole 12 is punched through the adhesive-coated foil 9 at every point at which a contact 17 (conductive connection) is provided between the contact areas 6 of the first conductor layer 7 and the corresponding connecting areas 16 of the second conductor layer 19. The holes 12 have a circular shape, as can be seen especially in FIG. 5.

Figure 3:
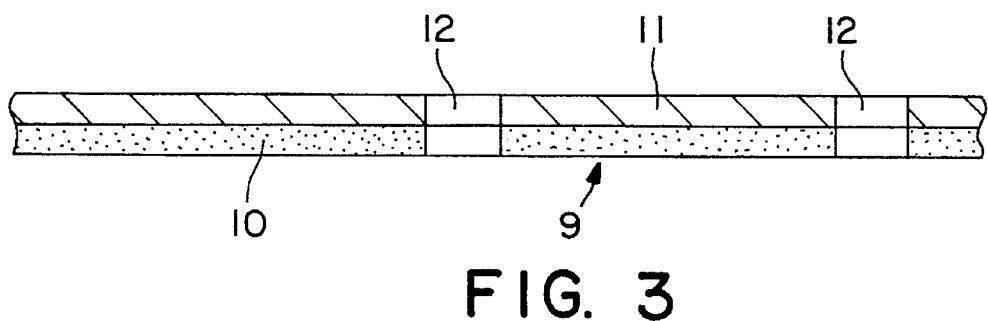
FIG. 3 shows the perforated conductive foil having the adhesive coating, in section.
Figure 4:
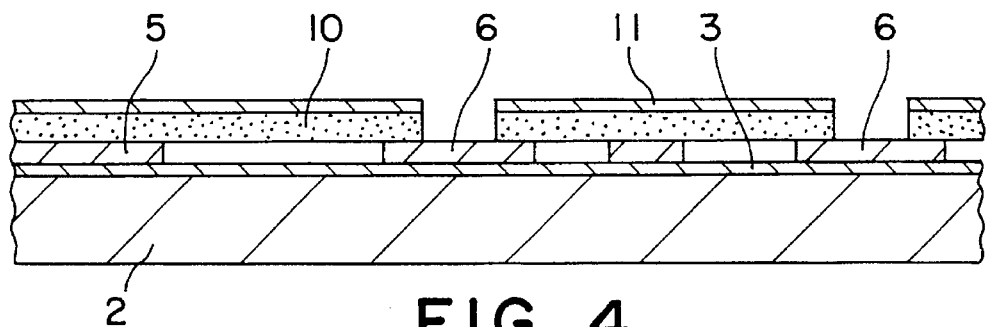
FIG. 4 shows the carrier board having the perforated conductive foil fixed thereon, in section.

The punched foil 9 (FIG. 3) is subsequently laid in a precisely fitting manner on the etched printed circuit board 8, is fixed by means of a number of adhesive spots and is compressed in a multi-openings press at a pressure of 100 bar. In this case, the press is heated to a temperature of approximately 160° C. The laminate 13, which is formed from the etched printed circuit board 8 and the punched foil 9, is heated within approximately 20 minutes to 160° C. during compression, by heat conduction. It is subsequently cooled within a further 30 minutes, while maintaining the pressure.

Figure 6:
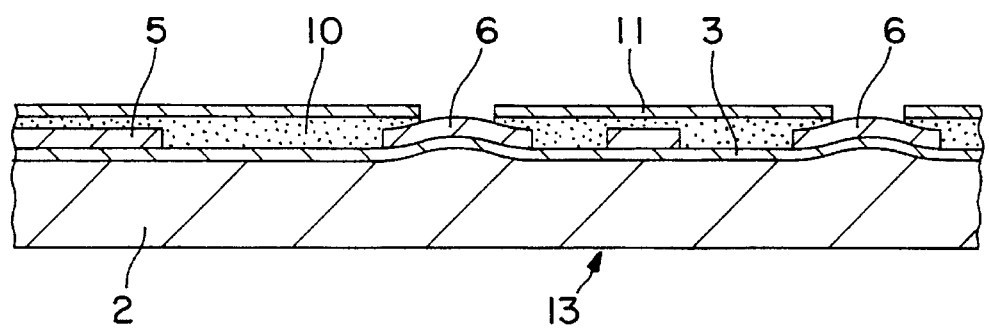
FIG. 6 shows a section through the printed circuit board after lamination.

During the pressing process, the adhesive coating 10 and the carrier board 2 of the etched printed circuit board 8 soften. Since the compression pressure is absent or is at least less at the points at which the foil 9 has the holes 12, the regions of the contact areas 6 of the first conductor layer 7 lying under the holes 12 are bulged upwards through the holes 12 in the direction of the surface of the second conductor layer 19. This effect can be seen well in FIG. 6. As a result of this partial bulging up of the contact areas 6 through the holes 12, penetration of the adhesive of the adhesive coating 10 into the holes 12 is largely suppressed. At the same time, the bulged up) surfaces of the contact areas 6 and the surfaces of the adjacent connecting areas 16 approach one another, at least for a short distance which is less than the thickness of the connecting areas 16, so that subsequent connecting by soldering is simplified. During the compression, the adhesive of the adhesive coating 10 is distributed into the intermediate space between the conductor tracks 5 and the contact areas 6 of the first conductor layer 7, an insulation coating 23 remaining between the conductor tracks 5 and copper foil 11. In the case of a conductor thickness of the first conductor layer 7 of 35 μm, a thickness of the adhesive coating 10 of 40 μm, selected in this exemplary embodiment of the invention, a remaining insulation thickness of approximately 15 to 20 μm is guaranteed, which leads to adequate insulation.

The conductor tracks 5 of the first conductor layer 7 can alternatively be pressed completely or partially into the surface of the carrier board 2 during the compression, depending on the hardness and viscosity of the adhesive of the adhesive coating 10 used and the resin of the carrier board 2, so that the thickness of the remaining insulation coating 23 corresponds approximately to the original thickness of the adhesive coating 10 (not shown in the figures).

Figure 7:
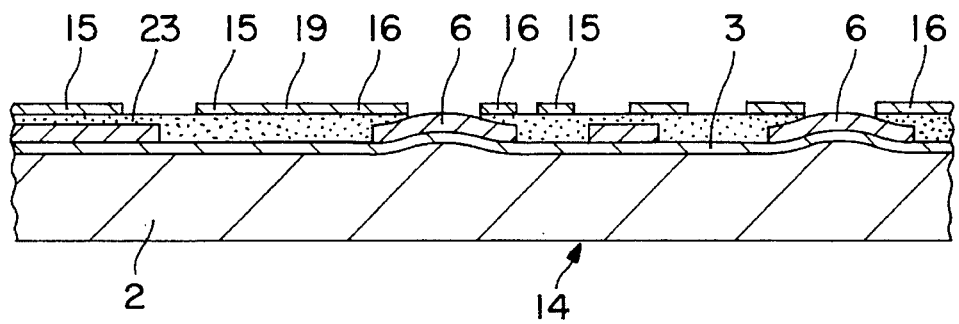
FIG. 7 shows a section through the printed circuit board after etching of the upper conductive foil.

After the lamination, the upper copper foil (conductive foil 11) is etched away in a manner known per se, with the exception of the second conductor layer 19, so that only the conductor tracks 15 and the connecting areas 16 are left from the copper foil (conductive foil 11) (FIG. 7).

The etched laminate 14 is subsequently provided With a solder resist 20, in a conventional manner. In this case, the upper connecting areas 16 are bounded in such a manner that they assume the shape of solder eyes which surround the regions of the contact areas 6 which are visible through the holes 12.

Figure 8:
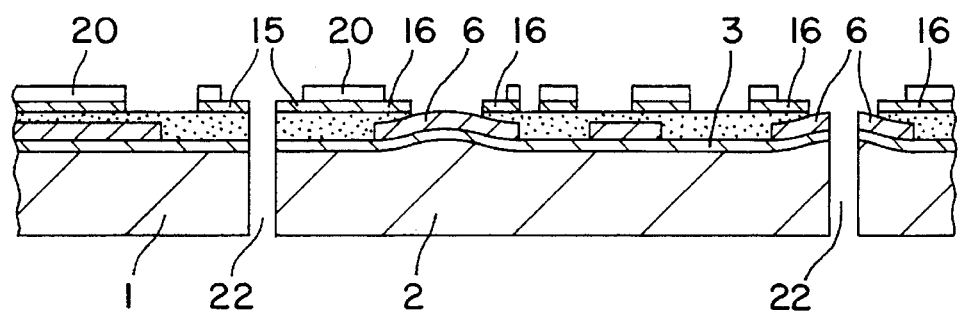
FIG. 8 shows a section through the printed circuit board after application of the solder resist.

After application of the solder resist 20, te two-layer printed circuit board 1 is drilled in a manner known per se (holes 22), is assembled (FIG. 8, FIG. 9), and is subsequently automatically soldered in the wave-soldering bath. In this case, on the one hand, the leads 21 of component parts are connected to the upper conductor tracks 15 of the second conductor layer 19 by means of the solder 18. The leads 21 can also be connected to corresponding solder eyes of the first conductor layer (not shown), if the adhesive coating 10 is either removed in advance of the appropriate points or is recessed by means of a larger hole in the foil 9.

Figure 9:
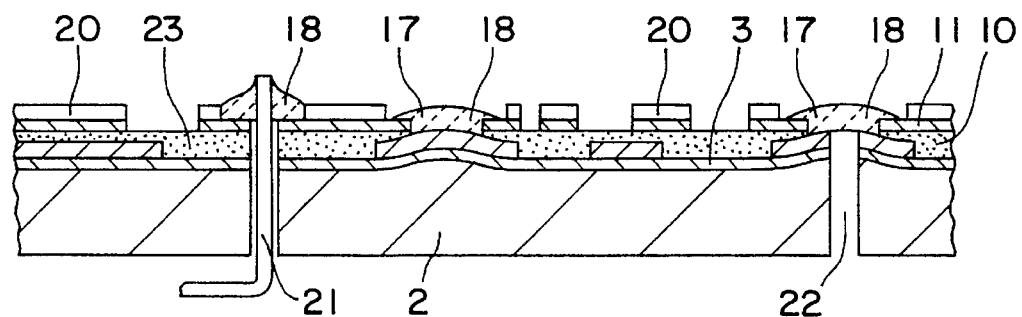
FIG. 9 shows a section through the assembled and soldered two-layer printed circuit board, the figures not being shown to scale.

FIG. 9 shows the contact 17 (conductive connection) between the connecting area 16 and the contact area 6, located underneath, by means of the solder 18. If necessary, an improvement in the reliability of the solder connection can be achieved by means of a vent hole 22 which passes through the connecting area 16, the contact area 6 and the carrier board 2.

For the reliability of the solder through-contact, it is essential that the surface of the contact area 6 has as little adhesive residue as possible and that the surface of the contact area 6 has been pressed as far as possible through the holes 12 in the adhesive-coated, perforated copper foil 9, and is thus located at approximately the same surface level as the connecting areas 16. By selecting an appropriate part of the surface of the contact area 6 which can be wetted with the solder 18 and of the connecting area 16 ensures that a uniform distribution, of the solder 18 is achieved by means of surface-tension effects.

The rear side of the carrier board 2 can also be provided with one or two additional conductor layers in the same manner in which the upper conductor layer 19 is applied.

Legend

1 Printed circuit board
2 Carrier board
3 Adhesive (for first conductor layer)
4 Copper foil (for first conductor layer)
5 Conductor track (for first conductor layer)
6 Contact area (for first conductor layer), pad
7 First conductor layer
8 Etched printed circuit board (single-sided)
9 Foil (adhesive-coated, perforated copper foil)
10 Adhesive coating (for second conductor layer)
11 Conductive foil (for second conductor layer)
12 Hole
13 Laminate before etching
14 Laminate after etching
15 Upper conductor track
16 Connecting area (second conductor layer), solder eye
17 Electrically conductive connection, contact
18 Solder
19 Second conductor layer
20 Solder resist
21 Lead of a component part
22 Hole
23 Insulation coating

We claim:

1. A method for producing a printed circuit board (1) with two or more conductor layers, having a carrier board (2) with a first conductor layer (7) thereon having contact areas (6) and a second conductor layer (19) having connecting areas (16), which process comprises laminating a conductive foil (11) provided with an adhesive coating (10), said adhesive coating (10) and conductive foil (11) having holes (12) therethrough which correspond to the contact areas (6) of the first conductor layer (7), onto the carrier board (2) over the first conductor layer (7) having the contact areas (6) at a temperature of more than 80° C. and pressure of 50 to 150 bar, such the contact areas (6) of the first conductor layer (7) bulge at least partially through the holes (12) towards the conductive foil (11), producing the second conductor layer (19) from the conductive foil (11) including conductive connecting areas (16) bordering the holes (12) in the adhesive coating (10), such that the contact areas (6) of the first conductor layer (7) are electrically conductively connectable to the corresponding connecting areas (16) of the second conductor layer (19) through the holes (12) of the adhesive coating (10) by means of soldering or by the application of a conductive paste, and such that the top surface of each contact area (6) which bulges through a hole (12) is at a distance from the top surface of the corresponding connecting area (16) which is less than the thickness of the connecting area (16).

2. The method according to claim 1, wherein the adhesive coating (10) consists of an acrylate adhesive softenable by heating, having a glass transition temperature, $T_G$, of 50°–70° C. and having a thickness of 20 to 150 μm.

3. The method claim 2, wherein the adhesive coating has a thickness of 35 to 60 μm.

4. The method according to claim 1, further comprising electrically conductively connecting the contact areas (6) of the first conductor layer (7) to the corresponding connecting areas (16) of the second conductor layer (19) by automatic soldering in a wave-soldering bath.

5. The method according to claim 4, further comprising, before soldering, drilling or punching at least one hole (22) through a connecting area and its corresponding contact area (6), said hole (22) further passing through the carrier board (2).

6. The method according to claim 1, wherein the carrier board (2) is a laminate consisting of paper layers impregnated with resin.

7. The method according to claim 6, wherein the conductive foil (11), provided with the adhesive coating (10), is laminated onto the carrier board (2) over the first conductor layer (7), under the influence of a pressure of 80 to 120 bar, at a temperature above 140° C.

8. The method according to claim 1, wherein the conductive foil (11), provided with the adhesive coating (10), is laminated onto the carrier board (2) over the first conductor layer (7), under the influence of a pressure of 80 to 120 bar, at a temperature above 140° C.

9. The method of claim 1, wherein the distance between the top surface of each contact area (6) which bulges through a hole (12) and the top surface of the corresponding connecting area (16) is less than 10 μm.

10. The method of claim 1, wherein the distance between the top surface of each contact area (6) which bulges through a hole (12) and the top surface of the corresponding connecting area (16) is less than half the thickness of the connecting area.

11. The method of claim 1, wherein each hole (12) is smaller in area than its corresponding contact area (6) and communicates only with the contact area of the first conductor layer (7).

12. The method of claim 1, wherein each connecting area (16) borders the entire periphery of its corresponding hole (12) to form a solder eye.

13. The method of claim 1, wherein the first and second conductor layers consist of copper.

14. A printed circuit board prepared according to the process of claim 1.

15. A printed circuit board (1) having a carrier board with two or more conductor layers, comprising a first conductor layer (7) on the carrier board and a second conductor layer (19) which conductor layers are separated by an adhesive coating (10), the first conductor layer (7) having contact areas (6) and the second conductor layer having connecting areas (16) corresponding thereto, each contact area (6) being electrically conductively connectable to its corresponding connecting area (16), the adhesive coating (10) having holes (12) at the points at which the contact areas (6) are electrically conductively connectable to the corresponding connecting areas (16), the contact areas (6) of the first conductor layer (7) are bulged at least partially through the holes (12) in the adhesive coating (10) towards the connecting areas (16) of the second conductor layer (19), and the top surface of each contact area (6) which bulges through a hole (12) is at a distance from the top surface of its corresponding connecting area (16) which is less than the thickness of the connecting area (16).

16. The printed circuit board of claim 15, wherein the distance between the top surface of each contact area (6) which bulges through a hole (12) and the top surface of the corresponding connecting area (16) is less than 10 μm.

17. The printed circuit board of claim 15, wherein the distance between the top surface of each contact area (6) which bulges through a hole (12) and the top surface of the corresponding connecting area (16) is less than half the thickness of the connecting area.

18. The printed circuit board of claim 15, further comprising a third conductor layer on the opposing side of the carrier board.

19. The printed circuit board of claim 15, further comprising third and fourth conductor layers, wherein the third and fourth conductor layers have the same features as defined for the first and second conductor layers.

20. The printed circuit board of claim 15, wherein the first and second conductor layers consist of copper.

* * * * *